United States Patent [19]

Murali et al.

[11] Patent Number: 4,966,868
[45] Date of Patent: Oct. 30, 1990

[54] PROCESS FOR SELECTIVE CONTACT HOLE FILLING INCLUDING A SILICIDE PLUG

[75] Inventors: Venkatesan Murali; Chih-Shih Wei, both of Sunnyvale; David B. Fraser, Danville, all of Calif.

[73] Assignee: Intel Corporation, Santa Clara, Calif.

[21] Appl. No.: 406,881

[22] Filed: Sep. 13, 1989

Related U.S. Application Data

[63] Continuation of Ser. No. 194,447, May 16, 1988, abandoned.

[51] Int. Cl.$^5$ .......................................... H01L 21/283
[52] U.S. Cl. .................................. 437/193; 437/200; 437/57
[58] Field of Search ............... 437/192, 193, 194, 195, 437/200, 57

[56] References Cited

U.S. PATENT DOCUMENTS

| | | | |
|---|---|---|---|
| 3,753,774 | 8/1973 | Veloric | 148/DIG. 147 |
| 4,458,410 | 7/1984 | Sugaki et al. | 437/200 |
| 4,463,491 | 8/1984 | Goldman et al. | 437/162 |
| 4,569,123 | 2/1986 | Ishii et al. | 437/162 |
| 4,800,177 | 1/1989 | Nakamae | 437/200 |

FOREIGN PATENT DOCUMENTS

| | | | |
|---|---|---|---|
| 0117719 | 6/1985 | Japan | 437/192 |
| 0208869 | 9/1986 | Japan | 437/200 |

OTHER PUBLICATIONS

Shatas, S. C., et al., "Heatpulse Rapid . . . , ", Workshop on Refactory Metal Silicides for VLSI, Sep. 1983, pp. 1–19.
Muranka, S. P., J. Vac. Sci. Technol., 17(4), Jul.–Aug., 1980, pp. 775–792.
Ghandi, S. K., VLSI Fabrication Principles, 1983, John Wiley & Sons, pp. 432–435.

Primary Examiner—Brian E. Hearn
Assistant Examiner—T. N. Quach
Attorney, Agent, or Firm—Blakely, Sokoloff, Taylor & Zafman

[57] ABSTRACT

A process which provides for self-aligned contact hole filling leading to complete planarization and low contact resistance at the same time, without the use of additional lithographic masking procedures is described. Further, the resultant conductive plug eliminates spiking problems between aluminum and silicon during a subsequent alloying process. In an embodiment, a selective polysilicon layer is deposited and appropriately doped; a second undoped selective silicon layer is then deposited, followed by a refractory metal layer, These layers are heated to produce a self-aligned refractory metal silicide plug.

6 Claims, 3 Drawing Sheets

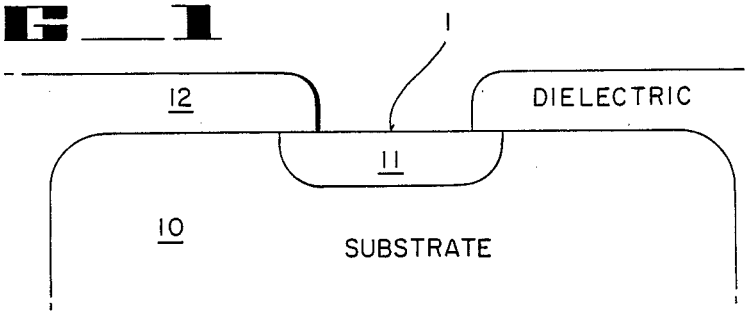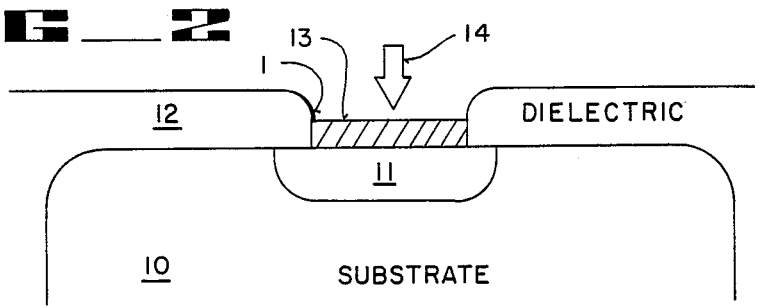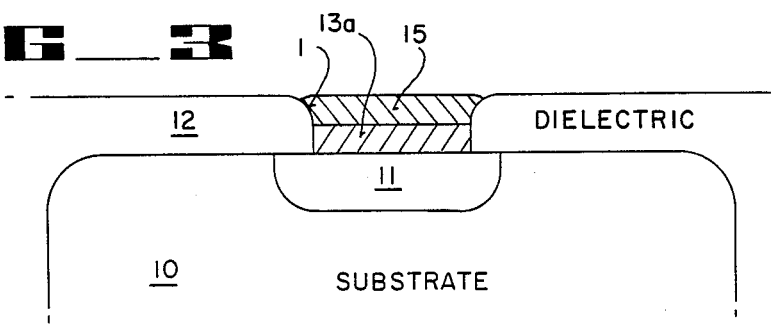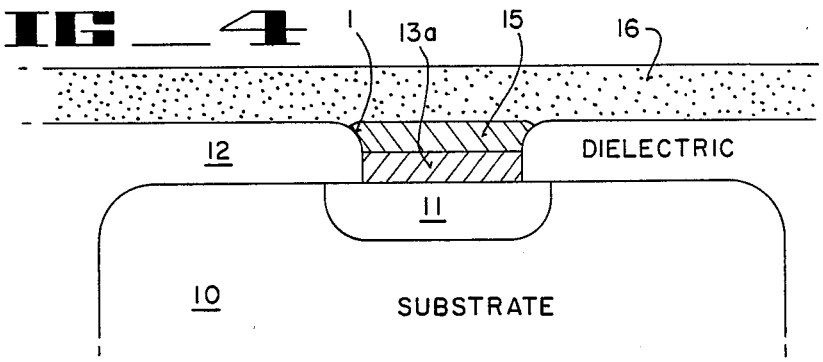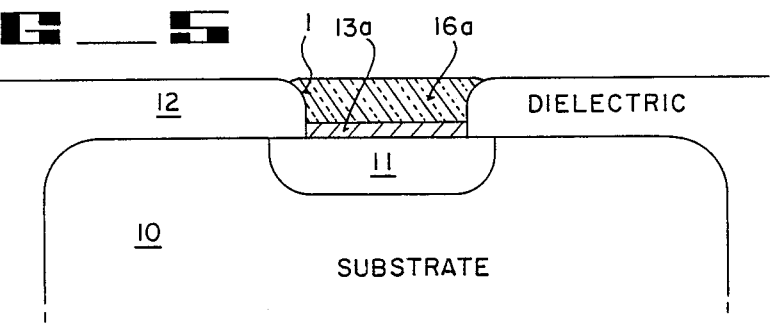

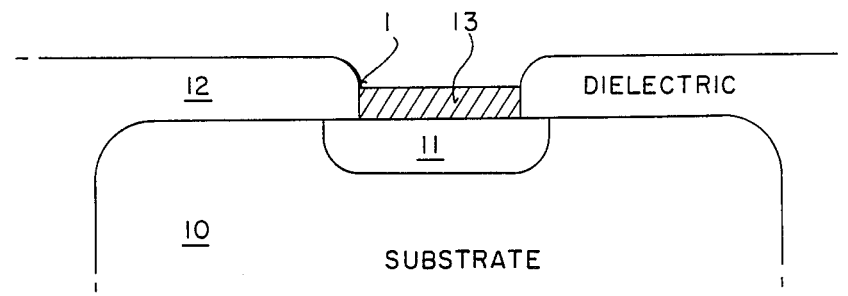
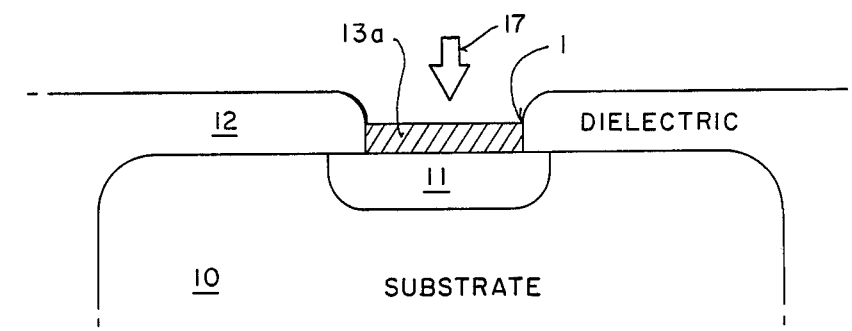
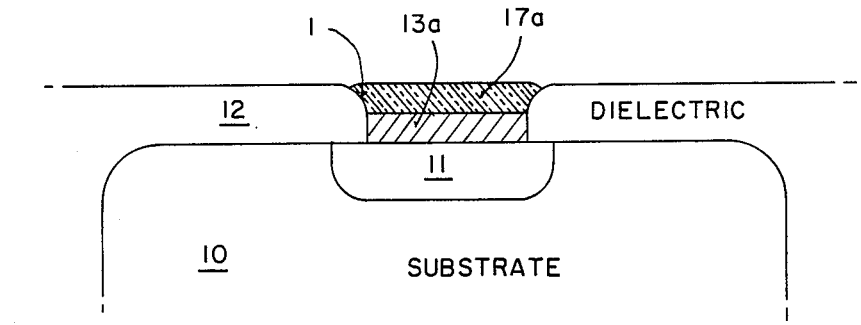

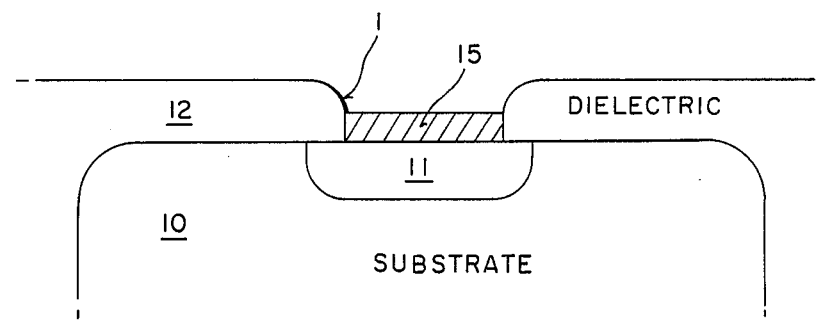
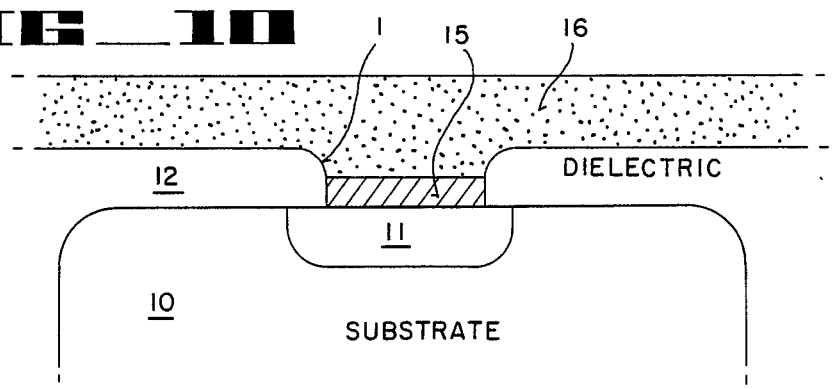
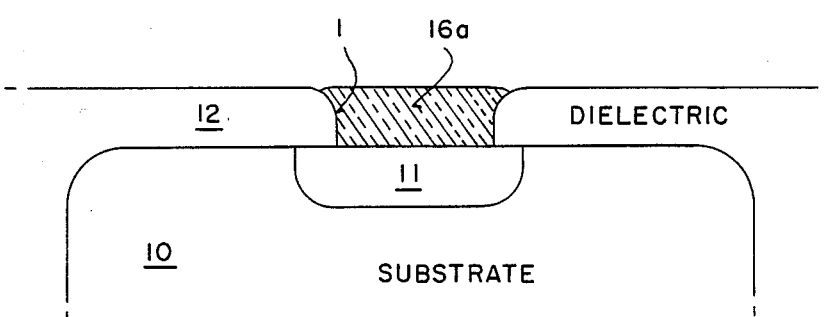

PROCESS FOR SELECTIVE CONTACT HOLE FILLING INCLUDING A SILICIDE PLUG this is a continuation of application 07/194,447, filed May 16, 1988, now abandoned.

BACKGROUND OF THE PRESENT INVENTION

1. Field of the Invention

The present invention relates to filling contact holes in a semiconductor substrate and, more specifically, to a selective deposition technique for filling contact holes and planarizing the surface at the same time.

2. Prior Art

As packing density of integrated circuits increases in very large scale integration (VLSI) technology, the need for planarization becomes more and more important. In the manufacture of silicon semiconductor devices, a variety of processes for filling contact holes are well known in the technology. The primary concern is the degradation of the junction integrity contact structure. Additionally, specific contact resistivity should be below $1 \times 10^{-6}$ ohms cm$^2$. This lower specific resistivity is essential for better device performances. For NMOS(n-channel metal oxide semiconductor) and PMOS (p-channel metal oxide semiconductor) processes, an in-situ doped polysilicon plug can be used for contact hole filling. However, in CMOS (complimentary metal oxide semiconductor) processing, the use of in-situ doped polysilicon contact plugs requires additional masking steps. These additional steps increase processing complexities.

Polysilicon can also be doped by ion implantation. The dosage and energy requirements to dope thick polysilicon plugs are not compatible with other requirements, such as the integrity of the thick dielectric film. Further, the extended high temperature anneals required to diffuse the dopant over the entire silicon plug are unacceptable.

For CMOS technology, selective tungsten deposition or tungsten etch back techniques are among the most promising ones. However, these processes have several technological problems which prevent their use within the current technology framework. When using a selective tungsten plug, the junction integrity degrades and specific contact resistivity of such structures generally exceeds $1 \times 10^{-6}$ ohms cm$^2$. The complexity of etch back processes prohibits their use. Further, the current processes are not cost efficient.

As can be seen by the present technology, obtaining low contact resistance and conformal contact hole filling at the same time is very difficult and is one of the most serious problems in present integrated circuit processing.

The present invention describes a novel process which eliminates the junction integrity problem associated with existing contact fill processes and is CMOS compatible. Further, complete planarization of the contact hole and low contact resistance can be obtained at the same time. Additionally, the thick contact hole plugs produced with this process, act as diffusion barriers between aluminum (Al) and the substrate. This barrier prevents the spiking phenomenon which leads to junction degradation.

SUMMARY OF THE PRESENT INVENTION

The present invention describes a process for selectively filling contact holes on a semiconductor body with self-aligned silicide plugs. Once contact holes in a dielectric film are opened, selective polysilicon is deposited in the holes to a predetermined level. Ion implantation is performed and the dopant is activated to form n+ and p+ selective silicon plugs over n+ and p+ junction areas, respectively. This deposition and activation results in a doped selective silicon layer. Then a second layer of polysilicon is deposited to a predetermined level over the doped layer. Subsequently, titanium or cobalt is sputter deposited on a semiconductor body. Next a two-step rapid thermal annealing process and a selective metal etch process is carried out to silicide the layers previously deposited in the contact holes. In the annealing process, all of the undoped silicon and some of the doped selective silicon is consumed, thereby insuring a conductive plug. The reason for deposition and doping the first selective silicon layer is to make the process resilient to variations in metal and silicon thickness. The absence of the first selective silicon layer would lead to either excessive consumption of substrate silicon (leading to junction integrity problems) or an insufficient consumption of selective silicon plug (leading to unacceptable contact resistance). Further, the thick plug sufficiently protects the underlying silicon (Si) through a subsequent alloying process, thereby eliminating the spiking problems between aluminum (Al) and Silicon (Si). Such a structure can be easily engineered to obtain contact resistivities of less than $1 \times 10^{-6}$ ohms cm$^2$. This process can result in complete planarization of the surface of the semiconductor body.

An alternative of the present invention is a process whereby contact holes are opened and selective silicon is deposited. Ion implantation is performed and the dopants are activated forming doped n+ and p+ selective silicon or n+ and p+ junction areas, respectively. A layer of selective tungsten is grown over the resulting doped layer. Growing the tungsten over the doped layer eliminates the selective tungsten encroachment and tunneling problem of the current technology.

A second alternative of the present invention bypasses the initial deposition of selective silicon and subsequent ion implantation and activation. Once the contact holes are opened in the dielectric, a layer of selective polysilicon is deposited to a predetermined depth and remains undoped. Subsequently, a titanium, cobalt or other refractory metal layer of appropriate thickness is deposited and a two-step rapid thermal annealing process is performed to obtain self-aligned silicide plugs.

BRIEF DESCRIPTION OF THE DRAWINGS

FIG. 1 is a cross sectional elevation view of a semiconductor body of the present invention showing a cut contact hole in a thick dielectric layer.

FIG. 2 is a cross sectional elevation view showing the deposition of a first selective silicon layer and a representation of ion implantation to the device of FIG. 1.

FIG. 3 is a cross sectional elevation view of a semiconductor body showing a selective silicon layer and a second selective silicon layer overlaying the first layer to the device of FIG. 2.

FIG. 4 is a cross sectional elevation view of a semiconductor body showing both silicon layers within the contact hole overlaid by a refractory metal layer.

FIG. 5 is a cross sectional elevation view showing a contact body with the partially consumed first selective silicon layer and a conductive silicide plug.

FIG. 6 is a cross sectional elevation view of an alternative embodiment with a semiconductor body showing a contact hole selectively filled with a selective silicon layer.

FIG. 7 is a cross sectional elevation view showing a semiconductor body with a layer of selective silicon and a representation of ion implantation.

FIG. 8 is a cross sectional elevation view of a contact hole with a first layer of selective silicon and a layer of selective tungsten.

FIG. 9 is a cross sectional elevation view of an alternative embodiment with a semiconductor body with a selective silicon layer deposited within the contact hole.

FIG. 10 is a cross sectional elevation view of a semiconductor body showing a refractory metal layer overlaying the dielectric layer and the selective silicon layer.

FIG. 11 is a cross sectional elevation view of a semiconductor body showing a refractory metal silicide self-aligned in a contact hole.

DETAILED DESCRIPTION OF THE PRESENT INVENTION

An invention is described which selectively fills contact holes on a semiconductor body simultaneously planarizing the topography and providing low contact resistance. In the following description, numerous specific details are set forth such as specific thicknesses, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

FIGS. 1-5 illustrate the preferred embodiment which allows for selective filling of contact holes. The present invention has been demonstrated to planarize the topography and provide low contact resistivity, while effectively eliminating Al-Si spiking.

Referring to FIG. 1, a doped region 11, which may be a n+ or p+ region is formed on substrate 10. Substrate 10 is typically comprised of silicon. A dielectric layer 12 is deposited above substrate 10 in region 11. The preferred embodiment uses boropolysilicate glass (BPSG) as dielectric 12, although the present invention can be practiced by using various prior art dielectrics. A contact hole 1 is next cut into layer 12 exposing region 11. In the preferred embodiment the contact holes are 1 micron in diameter by 1 micron in depth with separations of 2 microns between the contact holes. Up to this point the steps are in preparation of fabrication of contact plugs. A variety of well-known prior art processes may be used to form region 11, the dielectric layer 12 and the contact hole 1.

Referring to FIG. 2, a layer 13 of selective silicon of appropriate thickness is deposited in the contact hole 1 over region 11. In the preferred embodiment, the layer 13 is deposited to a depth of 500-5000 Angstroms. Ion implantation, as represented by arrow 14, is carried out by one of a variety of well-known prior art processes. In the preferred embodiment when filling an n-channel hole, arsenic (As) is implanted into the layer 13 of selective silicon. Phosphorus (P) and Antimony (Sb) may also be used as ion implants. When filling a p-channel hole, boron (B) is the preferred ion for implantation into layer 13 of selective silicon. Once the implantation is complete the layer 13 is activated resulting in a doped selective silicon layer 13a referred to in FIG. 3.

Referring to FIG. 3, the resultant doped selective silicon layer 13a after activation forms a base upon which a second deposition of undoped selective silicon is received, thus forming layer 15.

Referring to FIG. 4, after the deposition and activation of layer 13 to the doped silicon layer 13a and deposition of layer 15a refractory metal layer 16 is sputter deposited over the dielectric 12 and the filled contact hole 1. Although the preferred embodiment uses a refractory metal selected from a group consisting of titanium and cobalt, various refractory metals can be used.

Referring to FIG. 5, once the refractory metal layer 16 has been deposited, an annealing process is implemented together with a selective metal etch thus leaving a refractory metal silicide plug 16a consuming all of the undoped selective silicon and part of the doped selective silicon layer 13a and removing any excessive refractory metal from the dielectric layer 12. In the preferred embodiment, the annealing process is a rapid thermal annealing (RTA) process comprising the steps of: a first heating step to a temperature in the range of 600°-650° C. for a length of time in the range of 30-50 seconds; and a second heating step to a temperature of approximately 900° C. for a length of time in the range of 30-40 seconds. A selective titanium or cobalt etch is performed after the first heating step and prior to the second heating step.

Alternatively, one of a variety of prior art annealing processes can be used, such as furnace annealing (600°-650° C. for 30-40 minutes; 900° C. for 30-40 minutes).

FIGS. 6-8 illustrate an alternative embodiment of the present invention. Using the detailed description of FIG. 1 as the foundation, the process proceeds by depositing a layer 13 of selected silicon of a predetermined thickness in the contact hole 1, as illustrated in FIG. 6. In the alternative embodiment, the predetermined thickness ranges from 500-5000 Angstroms.

Referring to FIG. 7, once a selective silicon layer 13 is deposited, ion implantation, as represented by arrow 17, proceeds by one of a variety of well known processes in the prior art. In the preferred embodiment, arsenic (As) is implanted in the selective silicon layer in an n-channel. Other examples of n-channel dopants include phosphorus (P) and antimony (Sb). Boron (B) is implanted in the layer if the channel is a p-type. After the appropriate dose of ion is implanted, the dopant is activated, resulting in an n+ or a p+ selective silicon layer 13a over an n+ or p+ region, respectively.

After dopant activation, as illustrated in FIG. 8, a selective tungsten (W) layer 17a is grown on the doped selective silicon layer 13a, which acts like a buffer, filling the contact hole 1, thus completing planarization of the topography and preventing tungsten (W) encroachment as currently encountered in the present technology.

FIGS. 9-11 illustrate a second alternative embodiment of the present invention. Using the detailed description of FIG. 1 as the foundation, the process proceeds by depositing a layer 15 of selective silicon of a predetermined thickness (i.e., 0.5-0.6 microns) in the contact hole 1 as illustrated in FIG. 9.

Referring to FIG. 10 the selective silicon layer 15 remains undoped and a refractory metal layer 16, of 0.2-0.3 microns thickness is deposited over the undoped silicon layer 15 and the dielectric layer 12. After the deposition of the refractory metal layer 16 a two-step rapid thermal annealing (RTA) process is performed together with a selective metal etch thereby obtaining a conductive silicide plug 16a as shown in FIG. 11.

Although the present invention describes a preferred embodiment using specific materials and perimeters, such may be varied within the spirit and scope of the invention. Also, the description of two alternative embodiments does not foreclose the utilization of the principals of the present invention as described.

Thus, a novel method for providing selective contact hole filling simultaneously with topographical planarization and low resistance contacts is described.

We claim:

1. A process for selectively filling contact holes in a dielectric, each of said holes having a predetermined depth and overlying one of an n-type or p-type region on a complimentary metal oxide semiconductor (CMOS) device comprising the steps of:

depositing a selective polysilicon layer in said holes, said selective polysilicon layer having a thickness of not greater than one half of said depth of said holes;

implanting an n-type dopant in said holes overlying said n-type region, and implanting a p-type dopant in said holes overlying said p-type region by ion implantation;

activating said dopant in said holes resulting in a doped selective silicon layer;

depositing a second undoped selective silicon layer in said holes over said doped selective silicon layer until a predetermined level is reached;

depositing a refractory metal layer over said undoped second selective silicon layer;

annealing said layers to consume said undoped second layer and part of said doped selective silicon layer, producing a self-aligned refractory metal silicide plug.

2. The process as recited in claim 1 wherein said ion implant for said holes to said n-type region is selected from a group consisting of arsenic, phosphorus, and antimony and said ion implant for said holes to said p-type region is boron.

3. The process as recited in claim 2 wherein said refractory metal layer is selected from the group consisting of titanium and cobalt.

4. The process as recited in claim 3 wherein said annealing step is a rapid thermal annealing process comprising the steps of:

a first heating in the temperature range of 600–650 degrees Centigrade for a length of time in the range of 30–50 seconds;

a second heating in a temperature range of approximately 900 degrees Centigrade for a length of time in the range of 30–40 seconds.

5. The process as recited in claim 4 wherein a selective metal etching process is performed between said first heating step and said second heating step of said annealing process.

6. The process as recited in claim 5 wherein said self-aligned silicide plug has a specific contact resistivity of less than $10^{-6}$ ohms cm$^2$.

* * * * *